(12) United States Patent
Artman et al.

(10) Patent No.: US 11,656,006 B2
(45) Date of Patent: May 23, 2023

(54) THERMOELECTRIC COOLER SYSTEMS FOR THERMAL ENHANCEMENT IN IMMERSION COOLING AND ASSOCIATED METHODS THEREOF

(71) Applicant: Lenovo Enterprise Solutions (Singapore) Pte. Ltd., New Tech Park (SG)

(72) Inventors: Paul Artman, Research Triangle Park, NC (US); Jeffrey Holland, Research Triangle Park, NC (US); Vinod Kamath, Research Triangle Park, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 189 days.

(21) Appl. No.: 16/836,727

(22) Filed: Mar. 31, 2020

(65) Prior Publication Data
US 2021/0302074 A1 Sep. 30, 2021

(51) Int. Cl.
*F25B 21/02* (2006.01)
*H05K 7/20* (2006.01)

(52) U.S. Cl.
CPC .......... *F25B 21/02* (2013.01); *H05K 7/20236* (2013.01); *H05K 7/20272* (2013.01); *H05K 7/20281* (2013.01); *F25B 2321/023* (2013.01); *F25B 2321/0251* (2013.01)

(58) Field of Classification Search
CPC ...................... F25B 21/04; F25B 21/02; F25B 2321/0251; F25B 2321/023; H05K 7/20236; H05K 7/20272; H05K 7/20281; H05K 7/20763; H05K 7/2039
See application file for complete search history.

(56) References Cited

U.S. PATENT DOCUMENTS

| | | | | |
|---|---|---|---|---|
| 4,306,613 A | * | 12/1981 | Christopher | .......... F25B 23/006 165/104.34 |
| 2007/0064396 A1 | * | 3/2007 | Oman | .................... H01L 23/427 257/E23.088 |
| 2017/0150645 A1 | * | 5/2017 | Huang | .................. H05K 5/0026 |
| 2019/0082555 A1 | * | 3/2019 | Hooton | .................... B41M 5/24 |
| 2019/0338962 A1 | * | 11/2019 | Minnoy | .................. F24D 17/02 |

* cited by examiner

*Primary Examiner* — Frantz F Jules
*Assistant Examiner* — Martha Tadesse
(74) *Attorney, Agent, or Firm* — Olive Law Group PLLC

(57) ABSTRACT

Thermoelectric cooler systems for thermal enhancement in immersion cooling and associated methods thereof are disclosed. According to an aspect, a system includes a liquid vessel that defines an interior space for holding a cooling liquid and an electronic component. The system also includes a heat conduit including a first portion, a second portion, and a third portion. The heat conduit is configured to transfer heat between the portions. Further, the first portion is configured to transfer heat from the electronic component to the second portion. The second portion is configured to transfer heat to the cooling liquid and to the third portion. The system includes a thermoelectric cooler positioned within the interior space. The thermoelectric cooler includes an absorption side and a rejection side. The thermoelectric cooler is configured to transfer heat from the absorption side to the rejection side.

19 Claims, 9 Drawing Sheets

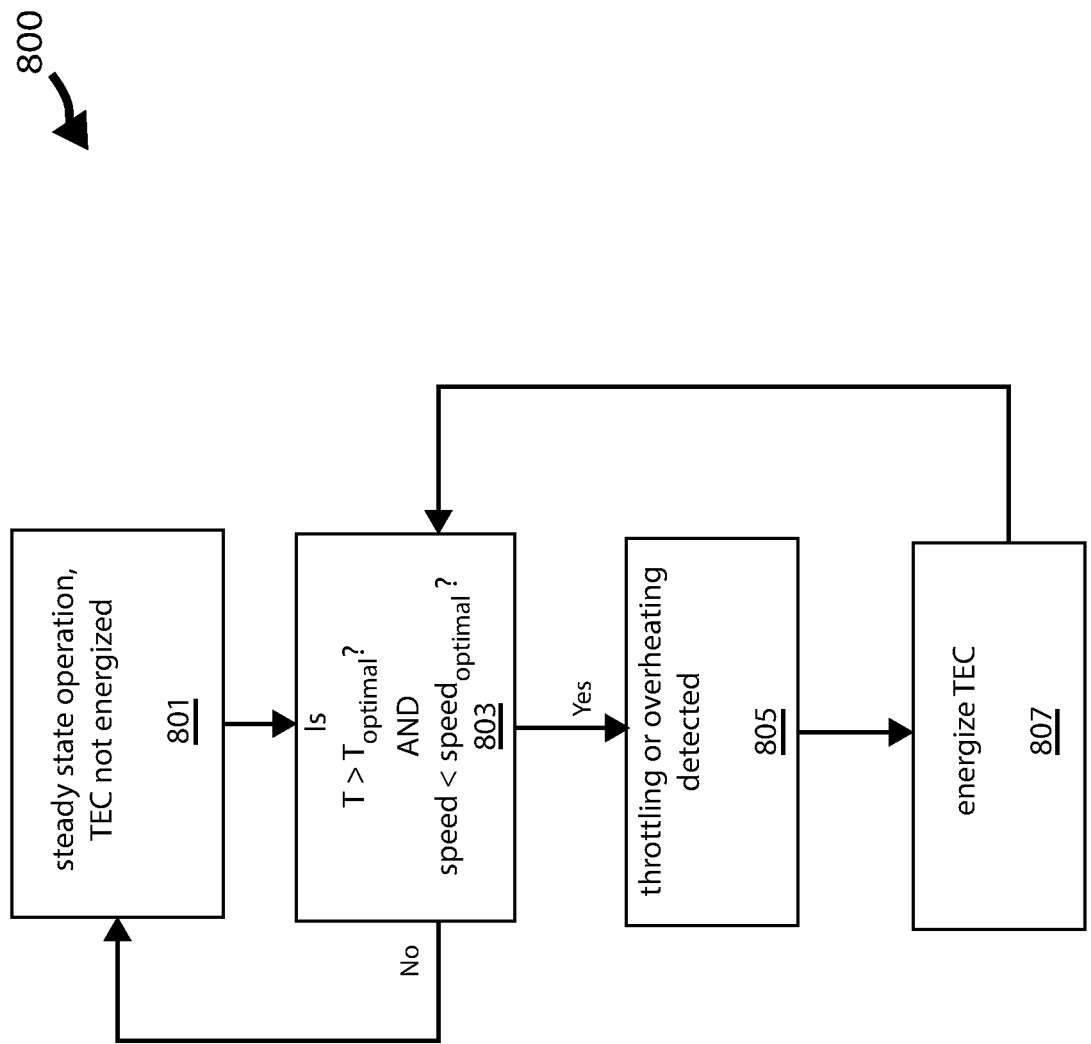

THERMOELECTRIC COOLER SYSTEMS FOR THERMAL ENHANCEMENT IN IMMERSION COOLING AND ASSOCIATED METHODS THEREOF

TECHNICAL FIELD

The presently disclosed subject matter relates generally to cooling systems for electronic components. Particularly, the presently disclosed subject matter relates to thermoelectric cooler systems for thermal enhancement in immersion cooling and associated methods.

SUMMARY

The presently disclosed subject matter pertain to thermoelectric cooler systems for thermal enhancement in immersion cooling and associated methods thereof. According to an aspect, a system includes a liquid vessel that defines an interior space for holding a cooling liquid and an electronic component. The system also includes a heat conduit including a first portion, a second portion, and a third portion. The heat conduit is configured to transfer heat between the portions. Further, the first portion is configured to transfer heat from the electronic component to the second portion. The second portion is configured to transfer heat to the cooling liquid and to the third portion. The system includes a thermoelectric cooler positioned within the interior space. The thermoelectric cooler includes an absorption side and a rejection side. The thermoelectric cooler is configured to transfer heat from the absorption side to the rejection side. The absorption side is in heat-conductive interface with the third portion of the heat conduit. The rejection side is in heat-conductive interface with the liquid vessel such that the thermoelectric cooler is configured to transfer heat from the third portion to outside of the vessel.

According to another aspect, a method includes providing a system that includes a liquid vessel that defines an interior space for holding a cooling liquid and an electronic component. The system also includes a heat conduit including a first portion, a second portion, and a third portion. The heat conduit is configured to transfer heat between the portions. The first portion is configured to transfer heat from the electronic component to the second portion. The second portion is configured to transfer heat to the cooling liquid and to the third portion. The system includes a thermoelectric cooler positioned within the interior space. The thermoelectric cooler includes an absorption side and a rejection side. The thermoelectric cooler is configured to transfer heat from the absorption side to the rejection side. The absorption side is in heat-conductive interface with the third portion of the heat conduit. The rejection side is in heat-conductive interface with the liquid vessel and configured to transfer heat from the third portion to outside of the vessel. The method also includes activating the thermoelectric cooler.

According to another aspect, a method includes providing a system that includes a liquid vessel that defines an interior space for holding a cooling liquid and an electronic component. The system also includes a heat conduit including a first portion, a second portion, and a third portion. The heat conduit is configured to transfer heat between the portions. The first portion is configured to transfer heat from the electronic component to the second portion. The second portion is configured to transfer heat to the cooling liquid and to the third portion. The system includes a thermoelectric cooler positioned within the interior space. The thermoelectric cooler includes an absorption side and a rejection side. The thermoelectric cooler is configured to transfer heat from the absorption side to the rejection side. The absorption side is in heat-conductive interface with the third portion of the heat conduit. The rejection side is in heat-conductive interface with the liquid vessel and configured to transfer heat from the third portion to outside of the vessel.

The method also includes determining whether a predetermined condition is met for activating the thermoelectric cooler. The method also includes activating the thermoelectric cooler in response to determining that the predetermined condition has been met.

BRIEF DESCRIPTION OF THE DRAWINGS

The embodiments are illustrated by way of example and not limitation in the figures of the accompanying drawings in which like references indicate similar elements.

FIG. 8 is a flowchart of an exemplary method for thermoelectric cooling in accordance with embodiments of the present disclosure.

DETAILED DESCRIPTION

Figure 1:
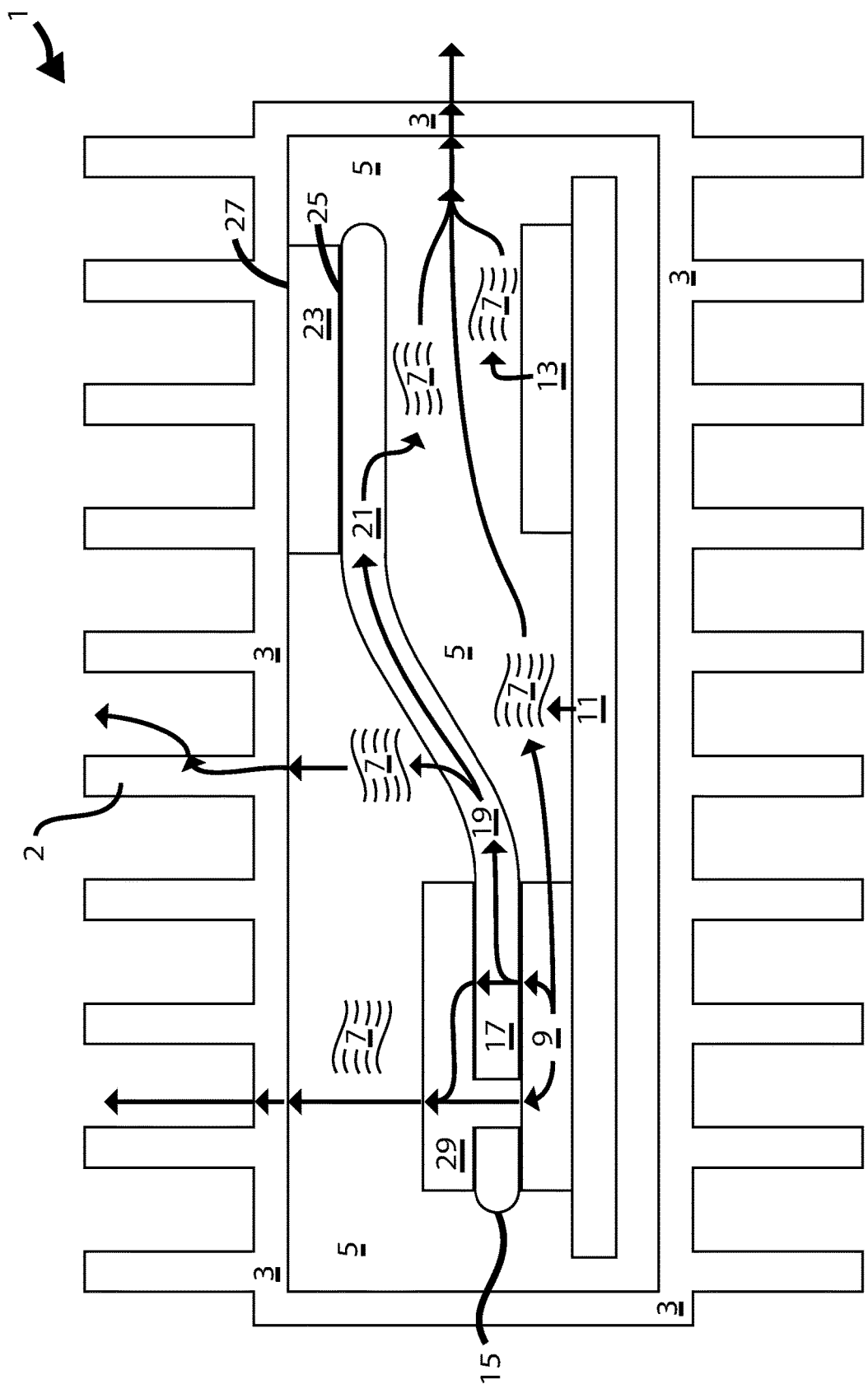
FIG. 1 is a side cross-sectional view of an exemplary system including a liquid vessel holding a cooling liquid, an electronic component, a heat conduit and a thermoelectric cooler, during steady state operation in accordance embodiments of the present disclosure.

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

Unless otherwise defined, all technical terms used herein have the same meaning as commonly understood by one of ordinary skill in the art to which this disclosure belongs.

The described features, structures, or characteristics may be combined in any suitable manner in one or more embodiments. In the following description, numerous specific details are provided, to provide a thorough understanding of embodiments of the disclosed subject matter. One skilled in the relevant art will recognize, however, that the disclosed subject matter can be practiced without one or more of the specific details, or with other methods, components, materials, etc. In other instances, well-known structures, materials, or operations are not shown or described in detail to avoid obscuring aspects of the disclosed subject matter.

The device or system for performing one or more operations on a memory of a computing device may be a software, hardware, firmware, or combination of these. The device or the system is further intended to include or otherwise cover all software or computer programs capable of performing the various heretofore-disclosed determinations, calculations, or the like for the disclosed purposes. For example, exemplary embodiments are intended to cover all software or computer programs capable of enabling processors to implement the disclosed processes. Exemplary embodiments are also intended to cover any and all currently known, related art or later developed non-transitory recording or storage mediums (such as a CD-ROM, DVD-ROM, hard drive, RAM, ROM, floppy disc, magnetic tape cassette, etc.) that record or store such software or computer programs. Exemplary embodiments are further intended to cover such software, computer programs, systems and/or processes provided through any other currently known, related art, or later developed medium (such as transitory mediums, carrier waves, etc.), usable for implementing the exemplary operations disclosed below.

In accordance with the exemplary embodiments, the disclosed computer programs can be executed in many exemplary ways, such as an application that is resident in the memory of a device or as a hosted application that is being executed on a server and communicating with the device application or browser via a number of standard protocols, such as TCP/IP, HTTP, XML, SOAP, REST, JSON and other sufficient protocols. The disclosed computer programs can be written in exemplary programming languages that execute from memory on the device or from a hosted server, such as BASIC, COBOL, C, C++, Java, Pascal, or scripting languages such as JavaScript, Python, Ruby, PHP, Perl, or other suitable programming languages.

As referred to herein, the terms "computing device" and "entities" should be broadly construed and should be understood to be interchangeable. They may include any type of computing device, for example, a server, a desktop computer, a laptop computer, a smart phone, a cell phone, a pager, a personal digital assistant (PDA, e.g., with GPRS NIC), a mobile computer with a smartphone client, or the like.

The present subject matter may be a system, a method, and/or a computer program product. The computer program product may include a computer readable storage medium (or media) having computer readable program instructions thereon for causing a processor to carry out aspects of the present subject matter.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a RAM, a ROM, an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present subject matter may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++, Javascript or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present subject matter.

Aspects of the present subject matter are described herein with reference to flowchart illustrations and/or block diagrams of methods, apparatus (systems), and computer program products according to embodiments of the subject matter. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

FIGS. 1-5 illustrates side cross-sectional views of an exemplary system 1 in distinct states of operation, having similar components and arrangements thereof.

Referring now to FIG. 1, the figure shows an exemplary system 1 including a liquid vessel 3 holding a cooling liquid 7, electronic components 9, 11, 13, a heat conduit 15 and a thermoelectric cooler 23, during steady state operation, in accordance with embodiments of the present disclosure. The system 1 comprises a liquid vessel 3 that defines an interior 5 space for holding a cooling liquid 7 and the electronic components 9, 11, 13. In this example, there are 3 electronic components that may radiate heat: a processor 9, a circuit board 11, and an additional electronic component 13. Although, it should be appreciated by those of skill in the art that the liquid vessel 3 may hold any suitable number of electronic components and also other components. Also, the interior of the liquid vessel 3 may be of any suitable size and shape different than the size and shape shown in the examples herein.

The system 1 may be surrounded by air, and the vessel 3 may be sized and shaped to transfer heat energy from the material of the vessel 3 to the surrounding fluid, the air, by convective heat transfer. In some embodiments, the vessel 3 is substantially flat and wide, relative to its height, and the width of the vessel 3 may be characterized by opposed sides on top and bottom that include heat-conductive fins extending away therefrom. The fins are sized and shaped to draw heat by conductive heat transfer from the material of the vessel 3 to the fins and reject heat to the surrounding air by convective heat transfer.

Within the interior 5, the aforementioned electronic components 9, 11, 13 can be immersed in the liquid 7. A heat sink 29 and a heat conduit 15, also referred to as a heat pipe, is on a top surface of the processor 9. The conduit 15 includes a proximal end and a distal end, and three portions: a first portion 17 proximate the proximal end, a third portion 21 proximate the distal end, and a second portion 19 extending between the first portion 17 and third portion 21.

The first portion 17 is in thermal contact with the processor 9, the heat sink 29 is in contact with the processor 9, and the heat sink 29 and first portion 17 are in thermal contact with one another. Thereby, the heat sink 29, conduit 15, and processor 9 are assembled and arranged such that the heat sink 29 is in heat conductive interface with the processor 9, the heat conduit 15 is in heat conductive interface with a heat sink 29, and the heat conduit 15 is in heat conductive interface with the processor 9.

Further, the heat conduit 15 can transfer heat between the portions 17, 19, 21. The first portion 17 can transfer heat from the processor 9 to the second portion 19. The second portion 19 can transfer heat to the cooling liquid 7 and to the third portion 21.

Also immersed in the liquid 7 is a thermoelectric cooler (TEC) 23. Specifically, the illustrated TEC 23 is a Peltier dielectric heat transfer device, which has a pair of opposed sides 25 and 27. When activated, the TEC 23 can pass energy between the sides, a heat absorption side 25 and a heat rejection side 27. While energized, the heat absorption side 25 is a "cold" side 25, and the heat rejection side 27 is a "hot" side 27 to objects and materials in such contact therewith as to be in heat-transfer interface.

The TEC 23 is in thermal contact with the third portion 21 of the conduit 15 on the heat absorption side 25 such that the TEC 23 (proximate the absorption side 25) is in heat-conductive interface with the third portion 21 of the conduit 15. The TEC 23 is in thermal contact with the material of the vessel 27 on the heat rejection side 27 such that the TEC 23 (proximate the rejection side 27) is in heat-conductive interface with the material of the liquid vessel 3. Thereby, when activated, the TEC 23 can transfer heat from the third portion 21 to the outside the vessel 3 and/or the fluid/air surrounding the vessel 3. In some embodiments, the heat conduit 15 is also in contact with the liquid 7 and is thereby in heat-convective contact with the liquid 7.

The heat conduit 15 can transfer heat between the portions 17, 19, 21 by being a heat pipe holding a contiguous volume of fluid within the first portion 17, second portion 19, and third portion 21. In some embodiments, the heat conduit 15 may be a sealed pipe containing a volume of ammonia, alcohol, or water. The second portion 19 extends between the first portion 17 and third portion 21, traversing an amount of the interior 5 that holds the liquid 7, without being in direct contact with either of the processor 9 and TEC 23. Thereby, the second portion 19 of the conduit 15 is in heat-convective interface with the liquid 7.

Each of the following, also immersed in the liquid 7, may be in heat-convective interface with the liquid 7: the processor 9, the heat sink 29, the circuit board 11, and the additional electronic component 13. Other exemplary embodiments may include the TEC 23 and/or other portions of the conduit 15 (such as first portion 17) arranged as to be configured for convective heat-transfer with the liquid 7.

FIG. 1 illustrates the system 1 in steady state operation, a state comprising several contemporaneous, alternative, and/or proportionally variable paths for effecting heat transfer through the system 1, from the heat-producing electronic components 9, 11, 13.

Beginning at the processor 9, there are three paths shown for transferring heat away from the processor (parallel to one another).

On a first path, in sequence: heat conducts from the processor 9 to the heat sink 29, convects from the heat sink 29 to the liquid 7, convects from the liquid 7 into an inner surface of the vessel 3, conducts through the material of the vessel 3, and convects out of the vessel 3 into the air surrounding the system 1.

On a second path, in sequence, heat convects from the processor 9 into the liquid 7, convects from the liquid 7 into the inner surface of the vessel 3, conducts through the material of the vessel 3, and convects into the air surrounding the system 1.

On a third path, heat conducts from the processor 9 to the first portion 17 of the conduit 15. From the first portion 17, there are several subsequent contemporaneous, alternative, and/or proportionally variable paths out of the system 1. These subsequent paths are depicted and described as occurring contemporaneously in unspecified proportions.

As to a first subsequent path, some heat conducts from the first portion 17 to the heat sink, and thereon is transferred similarly to the first path, above.

As to a second subsequent path, some heat flows from the first portion 17 to the second portion 19 (by convection through a contiguous volume of the fluid held within the conduit 15 and/or circulation of the fluid). From the second portion 19, some heat is transferred by convection into the liquid 7, and thereon out of the system similarly to the second path, above.

Heat which is not transferred from the second portion 19 into the liquid 7 can flow from the second portion 19 to the third portion 21 (by convection through the fluid held within the conduit 15 and/or circulation of the fluid). The third portion 21 is in convective heat transfer interface with the liquid 7 and conductive heat transfer contact with the TEC 23 (specifically the absorption side 25). In this state, however, the TEC 23 is not activated. When not activated, the heat-conductivity of the TEC 23 is much lower than the heat-conductivity of the liquid 7. Thereby, heat convects from the third portion 21 to the liquid 7, convects from the liquid 7 to the vessel 3, conducts through the material of the vessel 3, and convects into the air surrounding the system 1.

In some embodiments, as shown in this example of a steady state operation of the system 1, each of the heat radiating from the circuit board 11 and the heat radiating from the additional electronic component 13 has only a single path for transferring heat out of the system 1, respectively.

With respect to the path shown from the circuit board 11 to the fluid surrounding the system 1: the heat radiating from the circuit board 11 convects to the liquid 7 proximate the circuit board 11, and convects through the liquid 7 held in the interior 5 to the liquid 7 proximate the interior wall of the vessel 3, convects to the vessel 3, conducts through the material of the vessel 3, and convects into the air surrounding the system.

With respect to the path shown from the from the additional electronic component 13 to the fluid surrounding the system 1: the heat radiating from the additional electronic component 13 convects to the liquid 7 proximate the additional electronic component 13, convects to the vessel 3, conducts through the material of the vessel 3, and convects into the air surrounding the system.

Figure 2:
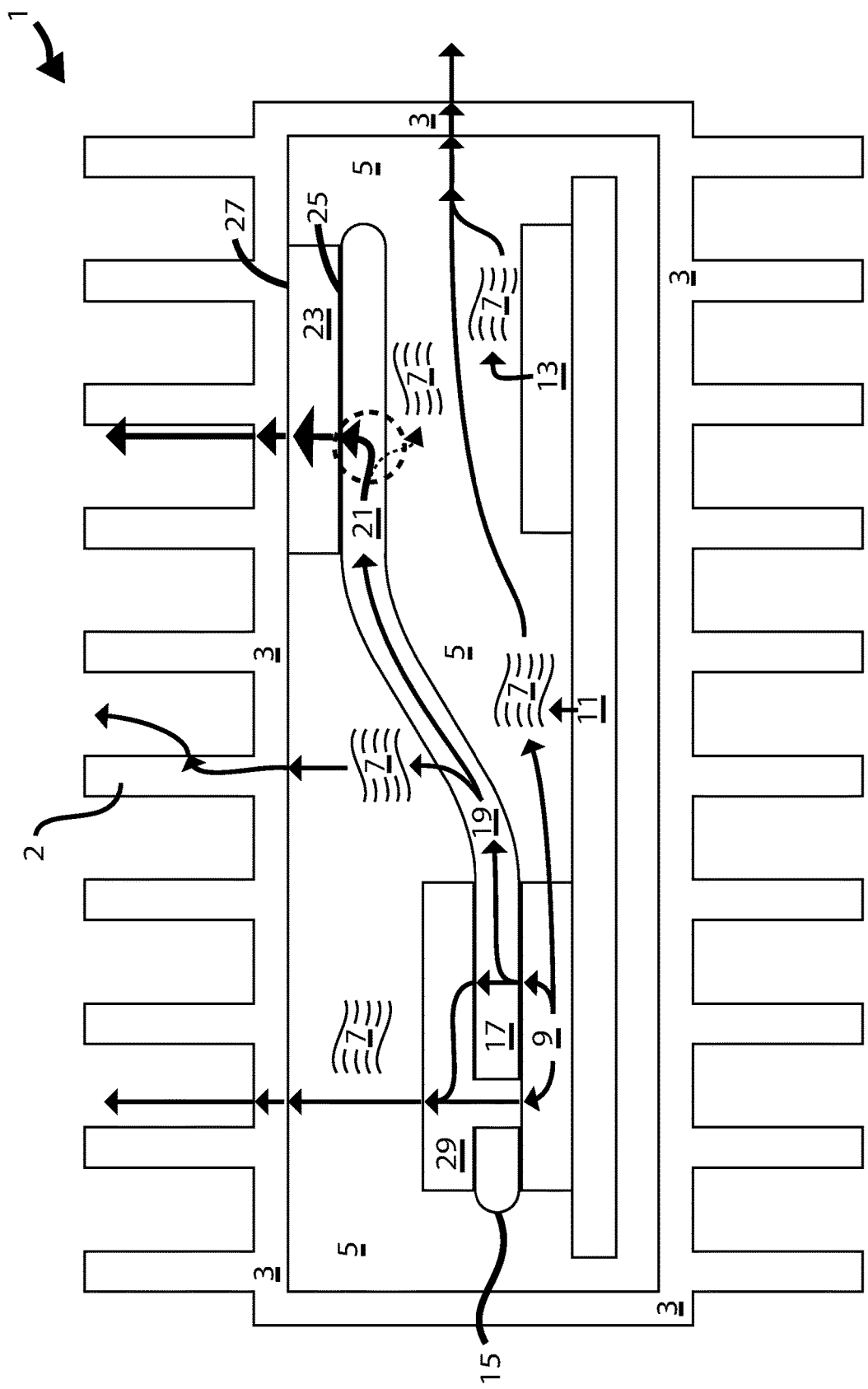
FIG. 2 is a side cross-sectional view of an exemplary system including a liquid vessel holding a cooling liquid, an electronic component, a heat conduit and a thermoelectric cooler, with thermoelectric cooler energized in accordance with embodiments of the present disclosure.

Referring now to FIG. 2, what is shown is a diagram of an exemplary system 1, that is similar to the system described with respect to FIG. 1, above. FIG. 2 shows a liquid vessel 3 holding a cooling liquid 7, electronic components (9, 11, 13), a heat conduit 15 and a thermoelectric cooler 23, with TEC 23 energized, in accordance with the present disclosure. See FIGS. 6-8 for flowcharts for energizing and de-energizing the thermoelectric cooler 23.

As described above, activating the TEC 23 effects it to pass thermal energy between its opposed sides (heat absorption side 25 and heat rejection side 27), rendering them a "cold" side (in heat conductive interface with the third portion) and a "hot" side (in heat conductive interface with the vessel 3).

The initial effect within the system 1 to activating of the TEC 23 is that heat begins to transfer away from the cold side 25 and toward the hot side 27. This decreases the temperature of the cold side and causes heat to conduct from the third portion 21 to the TEC 23 (see dotted circle proximate the third portion 21). In this particular embodiment, because some or approximately all of the heat in the third portion 21 now conducts to the TEC 23, less heat or negligible heat convects from the third portion 21 to the liquid 7 (denoted by the arrow in the dotted circle being changed to dotted arrow).

Note that, in this embodiment and in other contemplated exemplary embodiments, a local decrease in a stepwise path of heat transfer out of the system 1, such as the decrease in heat transfer to the liquid 7 proximate the third portion 21, above, may not decrease the total amount of heat which is transferred to the vessel 3 and/or otherwise out of the system 1.

Also, note that the embodiments shown in FIG. 2 (and also as to embodiments shown in FIGS. 3-5) are embodiments that can energize the TEC 23 such that it draws a significantly high amount of heat out of the system or greatly increase the rate of heat drawn out the system. Under at least one alternative exemplary embodiment of increasing heat transfer out of the system, the increase may substantially match a particular amount of heat which the electronic components are producing, in excess of the steady state rate of removing heat from the system 1. Under such a mode of operation, because the steady state paths provide an amount of heat transfer which requires no additional energy to be provided to the TEC 23, the TEC 23 may only be activated to a degree that causes the TEC 23 to remove the amount of excess heat or increase the rate of heat transfer out of the system the amount of excess rate of heat production that exceeds those quantities which pertain to steady state operation.

There are advantages to embodiments including increased amounts of heat transfer, however. A non-limiting list of some advantages to energizing the TEC 23 to an increased amount, in excess of a quantity that pertains to steady state operation, includes, but is not limited to: decreasing the frequency of energizing and de-energizing the TEC 23, decreasing the amount of heat held in the liquid that is away from the electronic components, providing an anticipatory excess of heat transfer ability to the cooling liquid, in anticipation of imminent operating circumstances that would overwhelm the ability of the system to adequately meet a sudden need for increased heat transfer out of the system, providing a mechanism that can compensate for a particular component that is operating incorrectly/making steady state operation erratic or difficult to maintain, and increasing the total performance of the system temporarily.

Figure 3:
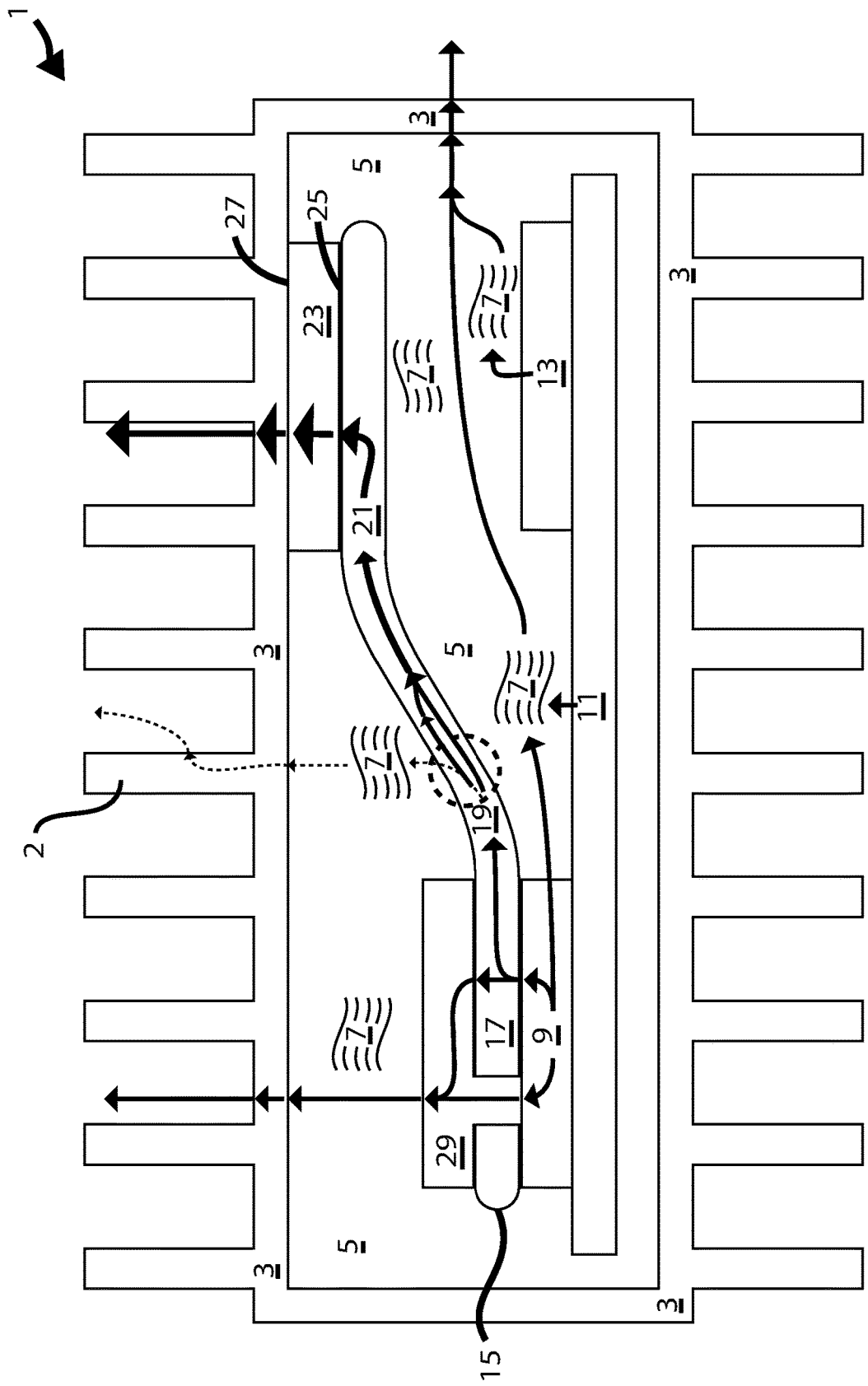
FIG. 3 is a side cross-sectional view of an exemplary system embodiment including a liquid vessel holding a cooling liquid, an electronic component, a heat conduit and a thermoelectric cooler, with cooling behavior following energizing the thermoelectric cooler in accordance with embodiments of the present disclosure.

Referring now to FIG. 3, what is shown is a diagram of an exemplary system 1 that is similar to the system described with respect to FIGS. 1 and 2, above. FIG. 3 shows a liquid vessel 3 holding a cooling liquid 7, an electronic component 9, 11, 13, a heat conduit 15 and a thermoelectric cooler 23, with cooling behavior following energizing the TEC 23, in accordance with the present disclosure. This state occurs after the initial activating of the TEC 23 (see FIG. 2).

In succeeding behavior of the system 1, with respect to FIG. 2, the effect within the system 1 following continued energizing of the TEC 23 is that the TEC 23 continues to draw the increased amount of heat drawn from the third portion 21, compared to steady state operation. This continued greater amount of heat transfer decreases the temperature and/or otherwise increases the ability of heat to flow from the second portion 19 to the third portion 21 (see dotted circle proximate the second portion 19), compared to FIG. 2. In this particular embodiment, because more or approximately all of the heat in the second portion 19 now flows to the third portion 21, less heat or negligible heat convects from the second portion 19 to the liquid 7 (denoted by the arrow in the dotted circle being changed to dotted arrow).

Figure 4:
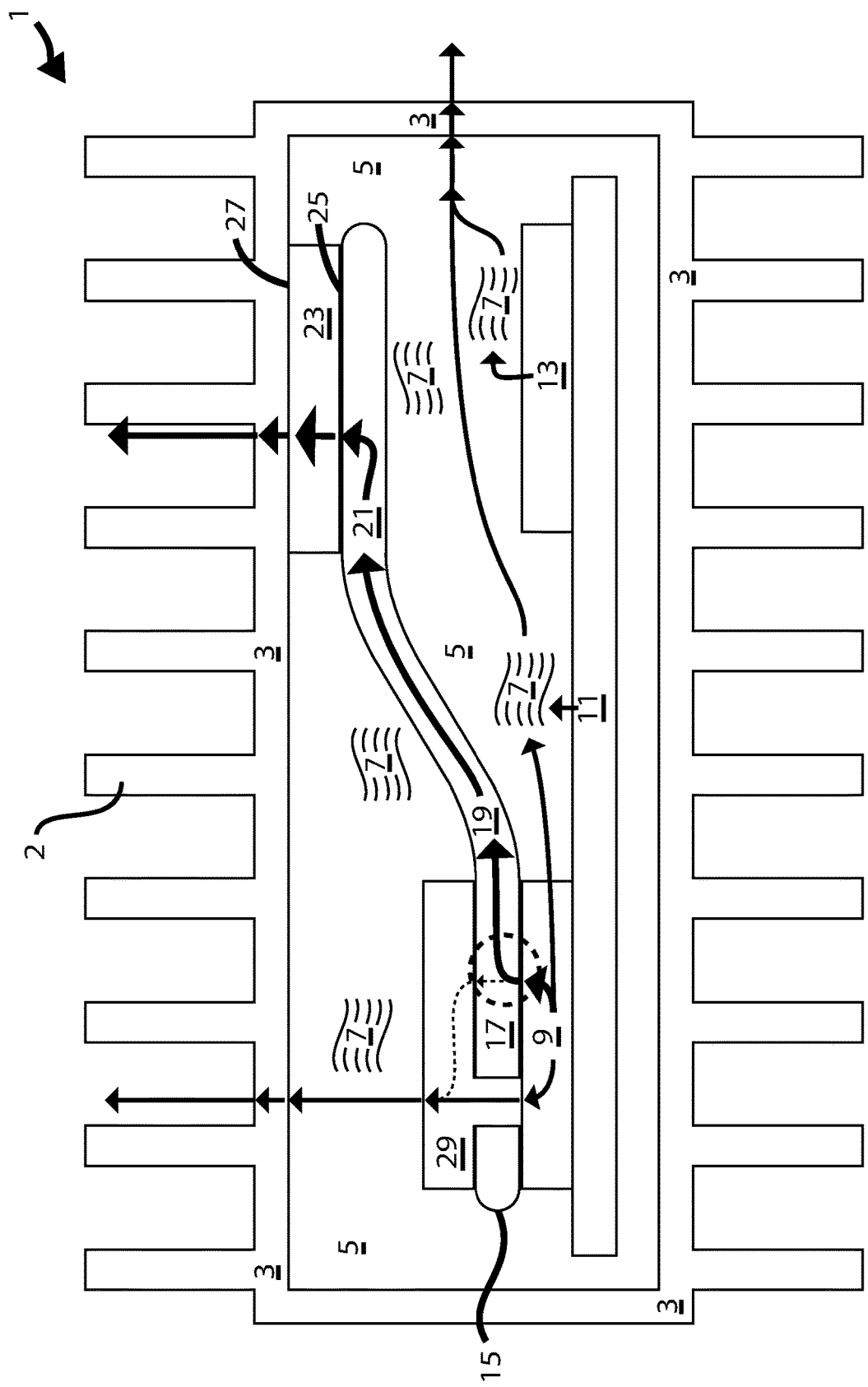
FIG. 4 is a side cross-sectional view of an exemplary system including a liquid vessel holding a cooling liquid, an electronic component, a heat conduit and a thermoelectric cooler, with continued cooling behavior with the thermoelectric cooler energized in accordance with embodiments of the present disclosure.

Referring now to FIG. 4, what is shown is a diagram of an exemplary system 1 that is similar to the system 1 described with respect to FIGS. 1-3 above. FIG. 4 shows a liquid vessel 3 holding a cooling liquid 7, electronic components 9, 11, 13, a heat conduit 15 and a thermoelectric cooler 23, with continued cooling behavior with the TEC 23 activating, in accordance with embodiments of the present disclosure. This state occurs as the increased cooling shown in FIG. 3 continues over several seconds or minutes after the conduit 15 experiences an increase in heat flow (particularly between the second portion 19 and the third portion 21, see FIG. 2).

Because the fluid in the conduit 15 is contiguous between the portions 17, 19, 21, the increased flow of heat from the second portion 19 to the third portion 21 causes additional heat to flow from the first portion 17 to the second portion 19, and thereby also increases the amount of heat which conducts from the processor 9 to the first portion 17. In some embodiments, the increase in heat conducted away from the processor 9 does not decrease the heat conducted to the heat sink 29 and the heat which convects to the liquid 7. Under an elevated response, a larger proportion of the heat which is produced by the processor 9 is transferred away from the processor 9 via the increase in the path of the heat that conducts to the first portion 17, decreasing the amount of heat which conducts to the heat sink 29 and convects to the liquid 9. Also, because the amount of heat which flows from the first portion 17 to the second portion 19 increases significantly, the heat which conducted from the first portion 17 to the heat sink 29 is reduced or negligible.

Figure 5:
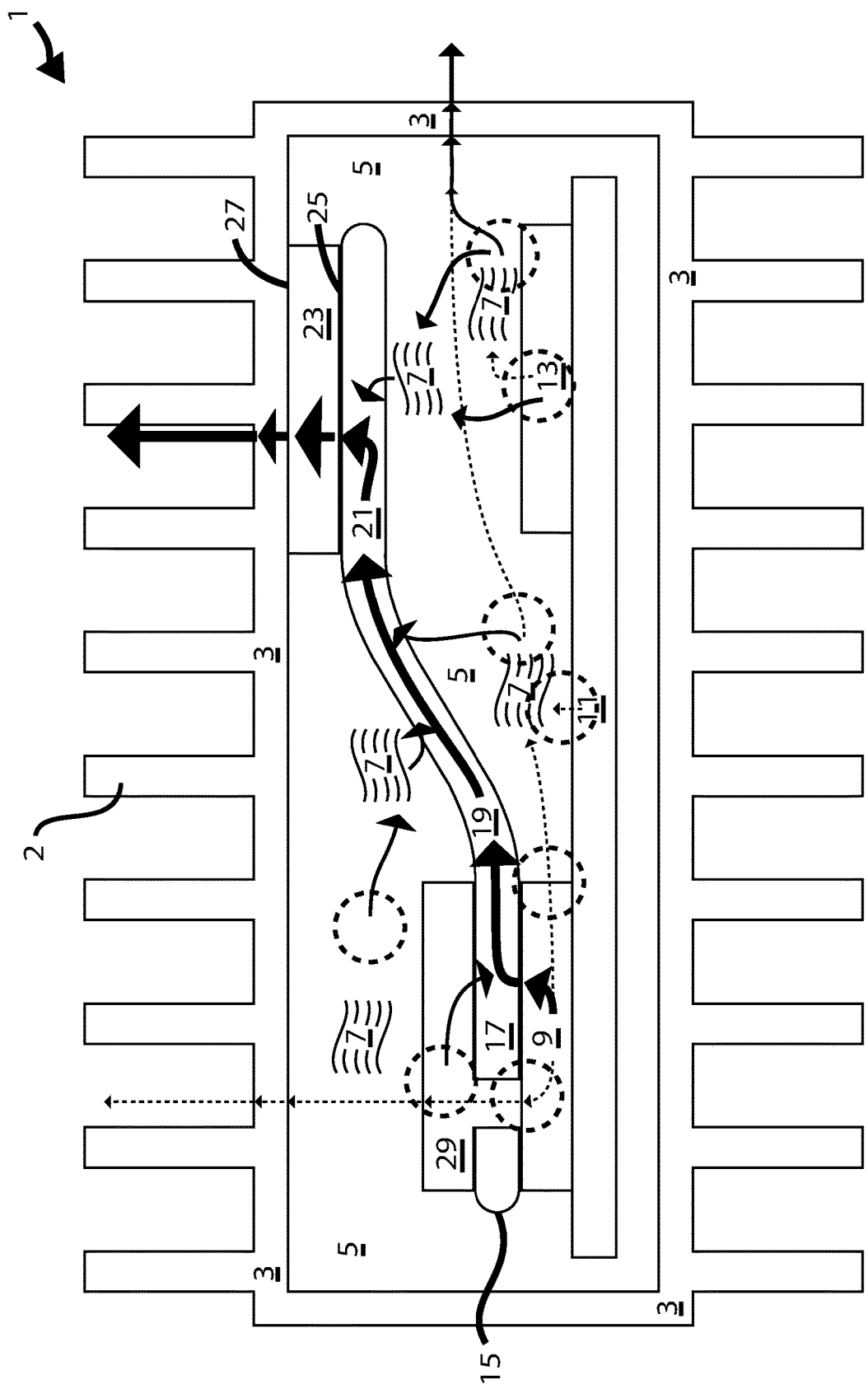
FIG. 5 is a side cross-sectional view of an exemplary including a liquid vessel holding a cooling liquid, an electronic component, a heat conduit and a thermoelectric cooler, with continued cooling behavior with the thermoelectric cooler energized for an extended duration in accordance with embodiments of the present disclosure.

Referring now to FIG. 5, what is shown is a diagram of an exemplary system 1 that is similar to the system 1 described with respect to FIGS. 1-4, above. FIG. 5 shows a liquid vessel 3 holding a cooling liquid 7, an electronic component 9, 11, 13, a heat conduit 15 and a thermoelectric cooler 23, with continued cooling behavior with the TEC 23 energized for an extended duration, in accordance with the present disclosure.

FIG. 5 illustrates the TEC 23 activated to such an amount or for such a duration that an elevated amount of heat transfer is performed by the TEC 23, to an extent that the conduit 15 has become the primary path for transferring heat out of the system 1.

Several dotted circles identify locations along steady state paths and paths of FIGS. 2-4 where heat has been redirected toward the conduit 15. Proximate the circle on the heat sink 29, a new solid arrow represents heat that conducts from the heat sink 29 to the first portion 17. Proximate the circle at the heat conductive interface of the processor 9 and the heat sink 29, and the circle at the heat convective interface of the processor 9 with the liquid 7, heat minimally transfers, and instead conducts from the processor 9 to the first portion 17. Circles proximate the locations in the liquid 7 that are proximate the convective interfaces of the liquid 7 with the heat sink 29, the circuit board 11, the additional electronic component 13, the third portion 21, and the circle on the additional component 13 represent redirection of convective heat transfer through the liquid 7 in the direction of the second portion 19 and third portion 21 of the conduit 15.

Figure 6:
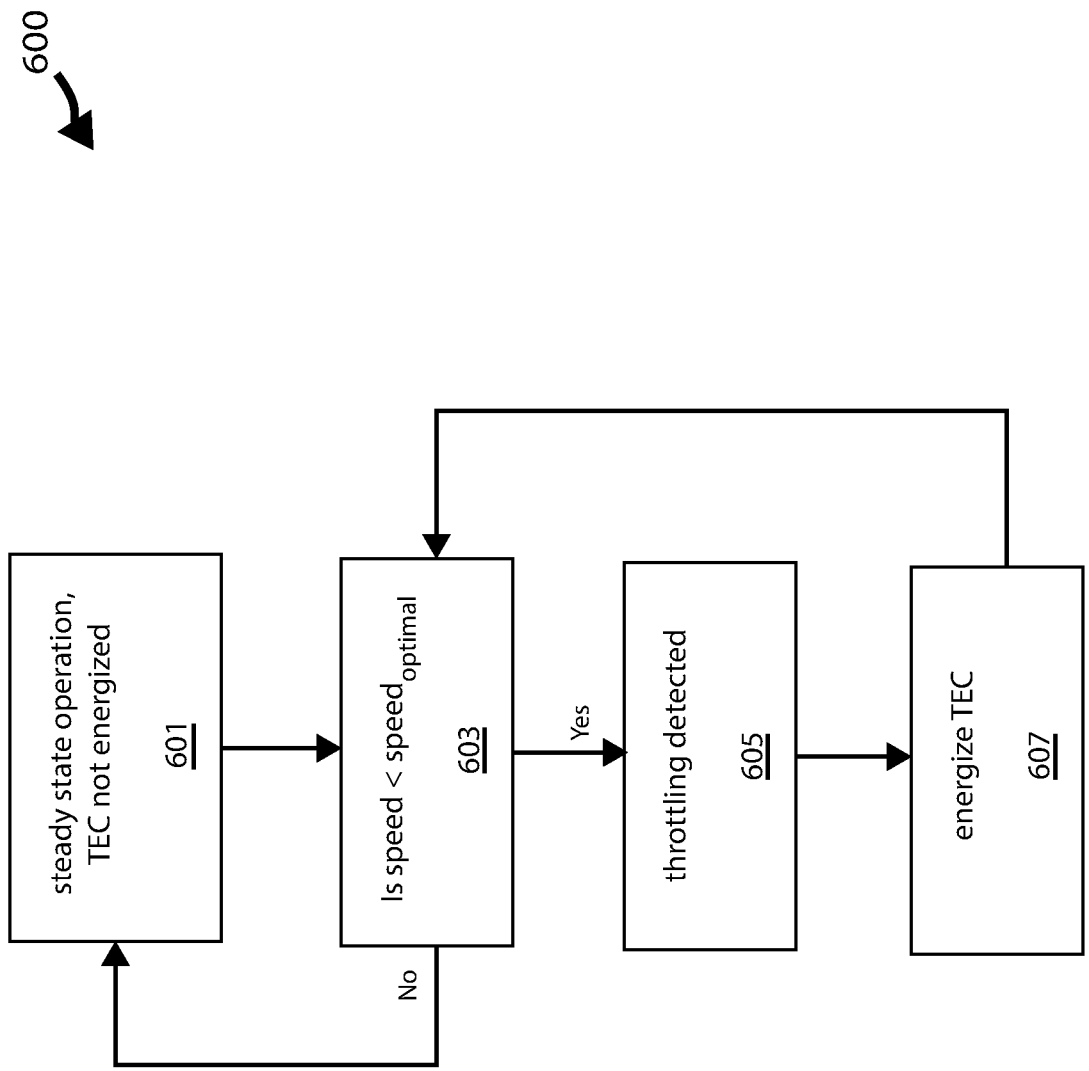
FIG. 6 is a flowchart of an exemplary method for thermoelectric cooling in accordance with embodiments of the present disclosure.

Referring now to FIG. 6, what is shown is a flowchart of an exemplary method 600 for thermoelectric cooling a system in accordance with embodiments of the present disclosure. A system begins by operating in steady state operation 601, with a thermoelectric cooler not energized 601. The system subsequently performs a step of comparing the present speed with an optimal speed speed$_{optimal}$ 603. If the present speed is below the optimal speed, the system performs a step of detecting that the system is throttling 605. The system subsequently proceeds to a step of energizing the thermoelectric cooler 607. The system then returns to the step of comparing the present speed with an optimal speed 603. Under circumstances where the performing step 603 determines that speed is not below the optimal speed, or repeats steps 605 and 607 are repeated until speed is determined to not be below the optimal speed, (step 603), the system may return to step 601, to maintain or recognize a return to steady state operation, with the TEC not activated.

Figure 7:
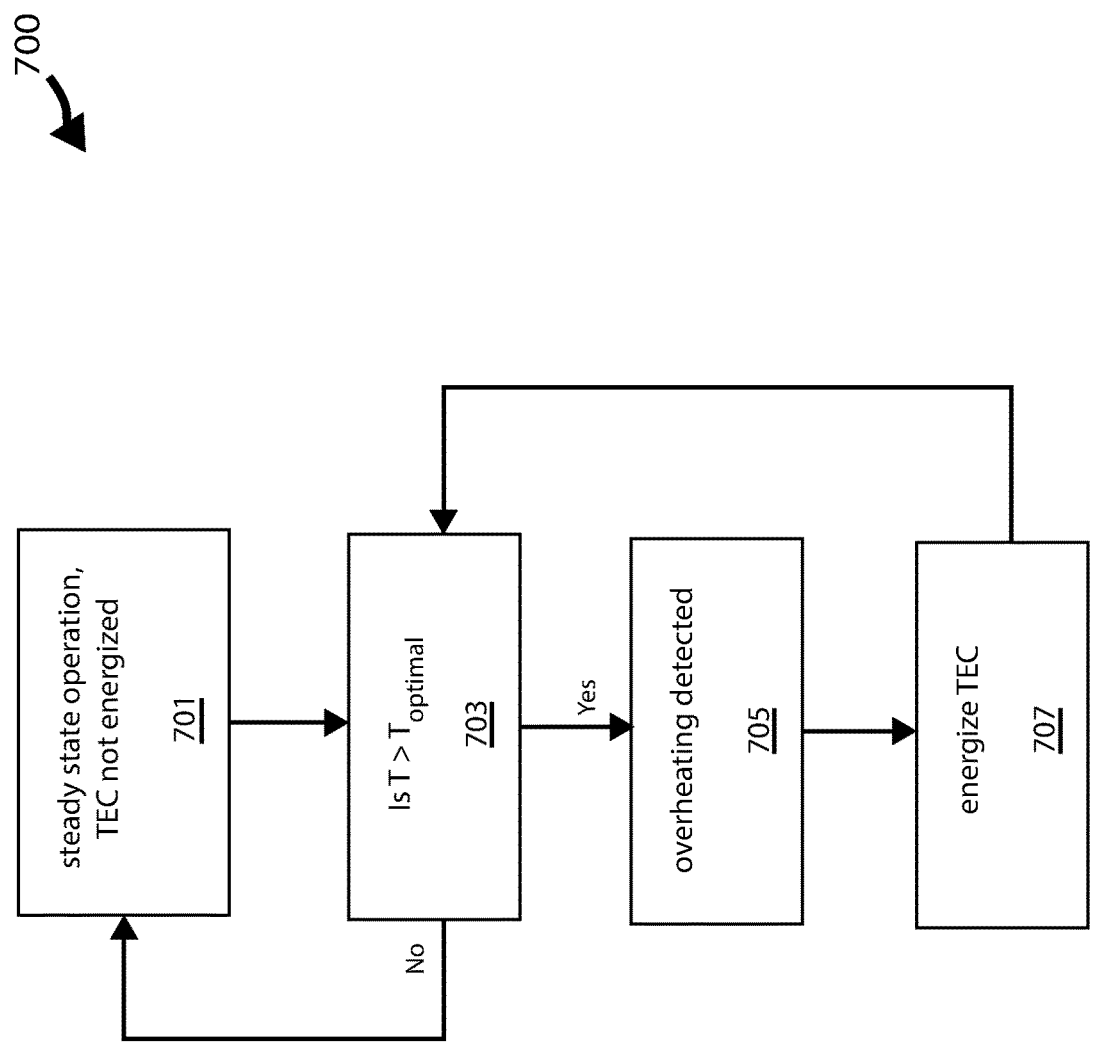
FIG. 7 is a flowchart of an exemplary method for thermoelectric cooling in accordance with embodiments of the present disclosure.

Referring now to FIG. 7, what is shown is a flowchart of an exemplary method 700 embodiment for thermoelectric cooling a system, in accordance with the present disclosure. A system begins by operating in steady state operation 701, with a thermoelectric cooler not energized 701. The system then performs a step of comparing the present temperature T with an optimal temperature $T_{optimal}$ 703. If T is above the optimal temperature, the system performs a step of detecting that the system is overheating 705. The system subsequently proceeds to a step of energizing the thermoelectric cooler 707. The system then returns to the step of comparing the present temperature T with an optimal temperature $T_{optimal}$ 703. Under circumstances where the performing step 703 determines that T does not exceed the optimal temperature, or steps 705 and 707 are repeated until T no longer exceeds the optimal temperature (step 703), the system may return to step 701, to maintain or recognize a return to steady state operation, with the TEC not activated, or de-activating the TEC.

Referring now to FIG. 8, what is shown is a flowchart of an exemplary method 800 for thermoelectric cooling a system in accordance with embodiments of the present disclosure. A system begins by operating in steady state operation 801, with a thermoelectric cooler not activated 801. The system subsequently performs a step of comparing the present speed with an optimal speed and comparing the present temperature T with an optimal temperature $T_{optimal}$ 803. If T is above the optimal temperature, the system performs a step of detecting that the system is at least one of throttling or overheating 805. The system subsequently proceeds to a step of energizing the thermoelectric cooler 807. The system subsequently returns to the step of comparing the present speed with the optimal speed and comparing the temperature T with an optimal temperature $T_{optimal}$ 803. Under circumstances where the performing step 803 determines that speed is not below the optimal speed and that T does not exceed the optimal temperature, or steps 805 and 807 are repeated until speed is not below the optimal speed and T no longer exceeds the optimal temperature (step 803), the system may return to step 801, to maintain or recognize a return to steady state operation, with the TEC not activated, or de-activating the TEC.

Figure 9A:
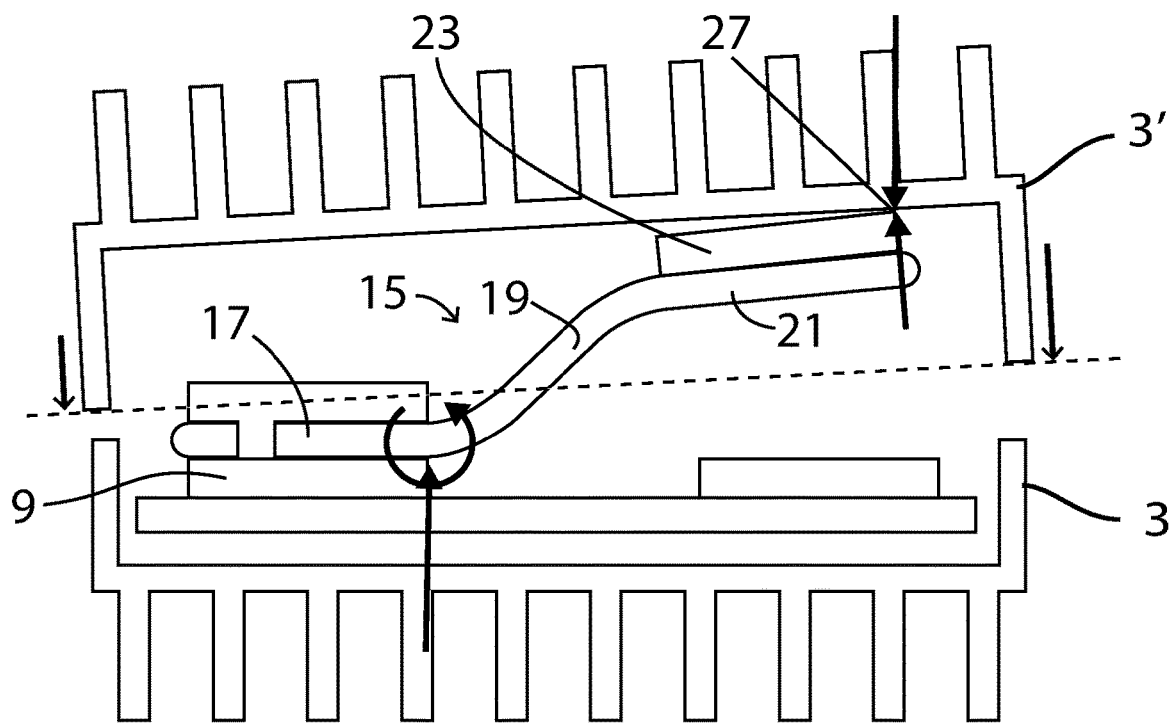
FIGS. 9A and 9B are diagrams of different states of an exemplary system including a liquid vessel in forceful contact with a thermoelectric cooler in accordance with embodiments of the present disclosure.
Figure 9B:
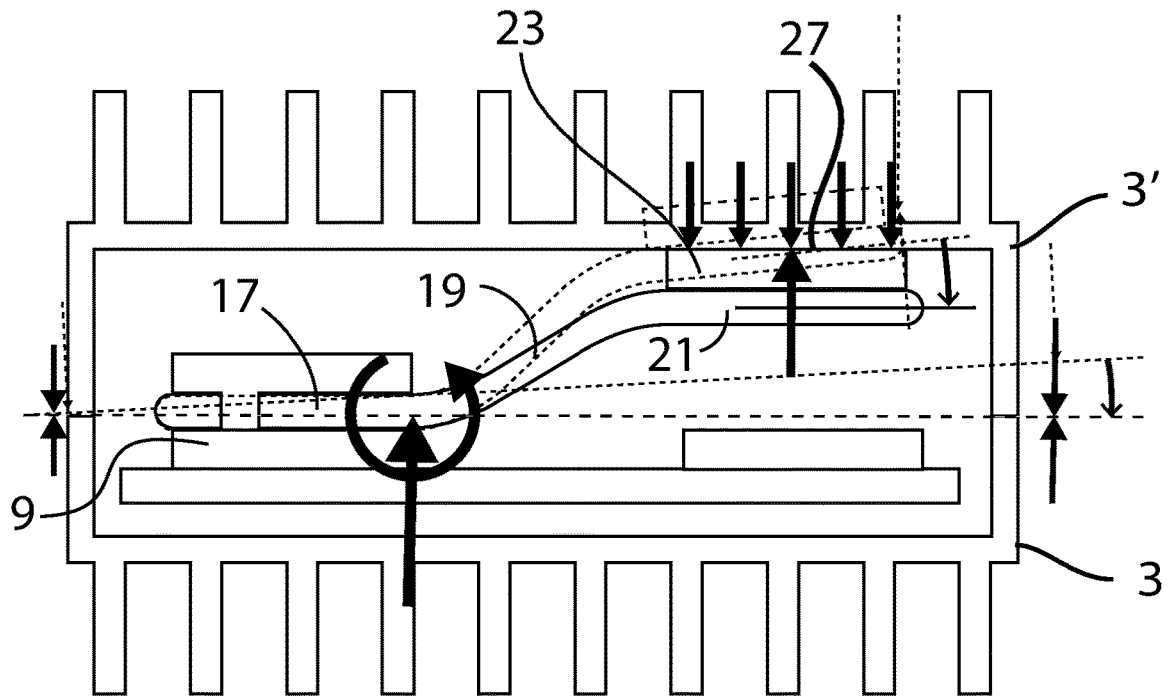

Referring now to FIGS. 9A-B, what is shown are diagrams of an exemplary system with views of a liquid vessel 3, 3' in forceful contact with a thermoelectric cooler 23 in accordance with embodiments of the present disclosure. The vessel is similar to that of FIGS. 1-5, but is shown as a two-piece assembly comprising a lower vessel portion 3 and an upper vessel portion 3', to illustrate an embodiment of how one contemplated vessel may be assembled.

Within the interior of the vessel (portions 3, 3') are an electronic component (processor 9 in this example), a heat conduit 15, and a thermoelectric cooler (TEC) 23. The heat conduit 15 includes a first portion 17, a second portion 19, and a third portion 21. As in FIGS. 1-5, the first portion 17 is arranged in thermal contact with the processor 9 (the lower portion 3 supporting and fixing the processor 9 against movement) at a proximal end of the conduit 15, and the third portion 21 is arranged in thermal contact with the TEC 23, at a distal end of the conduit 15. The second portion 19 abuts and extends between the first portion 17 (at a proximal end of the second portion 19) and the third portion (at a distal end of the second portion 17), traversing the interior (5, see FIGS. 1-5, with respect to the one-piece but otherwise similar vessel 3). In both FIGS. 9A and 9B, the conduit 15 is shown in forceful compressive contact between the vessel (particularly upper portion 3') and the electronic component (processor 9).

Referring now to FIG. 9A, the upper portion 3' and lower portion 3 are in close proximity without contacting one another, but the upper portion 3' has been brought into contact with the TEC 23. The direction of approach and divided portions of the initial forceful contact is represented by two arrows, to the left and right of the portion 3'. The component of the direction of force application to the TEC (the vertical component of the sum of the first two arrows) is shown by the vertical arrow aligned with the TEC 23 at a point of contact at the most-distal end of the rejection surface 27 of the TEC 23.

The response force against translation is provided by the processor 9, which is fixed against movement. It is shown by the vertical arrow aligned with the proximal end of the second portion 19. Because the lower portion 3 and the processor 9 do not translate in response to the vertical force applied by the upper portion 3', the magnitude of the response force is at least slightly in excess of the vertical force applied. Note the similar length and thickness of the arrows representing vertical force and the vertical response force.

Because the vertical force is offset horizontally from the processor by the length of the second portion and third portion, the response force effects a moment on the conduit 15, equal to the product of the vertical response force and a moment arm, the moment arm being the horizontal component of the length of the conduit, from the proximal end of the second portion, to the distal end of the third portion. This moment is represented by the counterclockwise arrow on the proximal end of the second portion 19. This arrangement, a member extending away from a fixed point, with a force applied to the member, offset by a distance horizontally along the length of the member, is a cantilever load. Therefore, the conduit 15 is in forceful compressive contact between the vessel (particularly the upper portion 3') and the electronic component (processor 9) proximate the third portion 21, such that a cantilever load is effected, with respect to the first portion (17).

The moment produces a vertical bending resistance force (not shown) at the point of contact of the upper portion 3' and the TEC 23. If the system were static, the vertical bending resistance force at the processor 9 would equal the vertical force applied by the upper portion 3'. However, because the conduit 15 is in a state of initial deflection, the vertical force applied by the upper portion 3' is in excess of the vertical bending resistance force.

A conduit bending force, the component of the vertical bending resistance force which is arranged perpendicularly to the TEC 23 and the length of the third portion 21, is shown because it better correlates with the force that occurs at the same location in 9B. The shorter length of the arrow representing the conduit bending force, with respect to the vertical force of the upper portion reflects that this figure depicts the upper portion 3' while it is descending, rather than representing a state of equilibrium before the state shown in FIG. 9B.

Referring now to FIG. 9B, the upper portion 3' has descended vertically and angularly, such that the upper portion and lower portion contact and align with one another. The change in orientation, with respect to FIG. 9A is shown by the decrease in the slope of the dotted line connecting the left and right sides of the upper vessel with respect to the angle of the corresponding dotted line in FIG. 1. The movement of the upper portion 3' to this position deflects the conduit 15, shown by comparing the present orientation with the orientation of the conduit in FIG. 1, illustrated in FIG. 9B as an overlaid dotted line copy of the prior orientation. The deflection is represented by a dotted line extending from the distal end of the overlaid dotted-line conduit, a solid line extending from the distal end of solid-line conduit, and an angular offset arrow therebetween.

In this new orientation, the upper portion 3' of the vessel is approximately aligned with and contacts the entire contact area of the heat-rejection side 27 of the TEC 23. Thereby, the vertical force applied in FIG. 1 is distributed over the entire contact area of the heat-rejection side 27 and is also applied perpendicularly to the heat rejection side 27. This is represented by the array of arrows that are perpendicular to the length of the TEC 23.

The distribution of the force applied by the upper portion 3' also corresponds to a decreased concentration of force that improves quality of contact between the heat-rejection side 27 and the vessel (upper portion 3'). With improved quality of contact, the conduit can have improved ability to effect heat transfer away from the processor 9 when the TEC 23 is energized (see FIG. 2).

Some embodiments may improve the quality of contact between the TEC 23 and the vessel (upper portion 3', also vessel 3, FIGS. 1-5) by additionally comprising a conducting substance or coating applied to at least one of the heat rejection side 27 and the upper portion 3' of the vessel before bringing the upper portion 3' of the vessel into contact with the TEC 23. In at least one such exemplary embodiment, one example method may include applying the substance close to the distal end of the TEC 23, such that the transition to aligned forceful contact (similar to FIG. 9B) spreads the substance evenly over the entire heat rejection side 27, and minimizes inconsistency of alignment between the upper portion 3' and the TEC 23.

Further, deflecting the conduit 15 increases the reaction moment on the conduit, with respect to the proximal end of the second portion 19, represented by the larger and thicker moment arrow shown at the proximal end of the second portion 19. The increase in the reaction moment corresponds to a higher bending resistance force, and therefore it requires the equivalent net vector of the vertical force (not shown) to correspondingly increase, relative to the vertical force shown in FIG. 9A, because it may need to overcome the deflection-induced increase in bending resistance force of the conduit 15. The magnitude of the cumulative vertical forces may need to further increase because the distribution of the vertical force effects a movement of the equivalent net force vector of the distributed load toward the proximal end of the second portion 19, decreasing the moment arm which facilitates a counter-moment to the moment generated by the conduit being deflected.

Because the bending resistance force may be a result of the moment effected by reaction to the vertical force, and the conduit 15 is presumably rigid between the proximal end and distal ends of the third portion 21, the arrow representing the bending resistance force is shown opposing the middle of the distributed vertical force applied by the upper portion 3', the moment arm location at which the equivalent force vector of the distributed load is applied.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A system comprising:
    a liquid vessel having an interior surface that defines an interior space, the liquid vessel being configured to hold a cooling liquid and an electronic component, wherein the electronic component is positioned within the cooling liquid of the interior space;
    a heat conduit in heat conductive contact with the electronic component and configured to conductively transfer heat from the electronic component; and
    a thermoelectric cooler positioned within the cooling liquid of the interior space,
    the thermoelectric cooler including an absorption side in heat conductive contact with the heat conduit and a rejection side in conductive contact with the interior surface, the thermoelectric cooler being configured to transfer heat from the heat conduit to the interior surface of the liquid vessel,
    such that the heat conduit is configured to transfer heat from the electronic component to the cooling liquid and configured to transfer heat from the electronic component to the absorption side of the thermoelectric cooler.

2. The system of claim 1, wherein the thermoelectric cooler comprises a dielectric Peltier thermoelectric cooling device.

3. The system of claim 1, wherein the heat conduit comprises a heat pipe configured to hold a contiguous volume of a fluid.

4. The system of claim 1, wherein the heat conduit comprises a sealed pipe containing a volume of ammonia, alcohol, or water.

5. The system of claim 1, wherein the heat conduit is in heat convective contact with the cooling liquid in the liquid vessel by being immersed in the cooling liquid.

6. The system of claim 1, wherein the heat conduit is in heat conductive interface with a heat sink.

7. The system of claim 6, wherein the heat sink is in heat conductive interface with the electronic component.

8. The system of claim 6, wherein the heat sink is in heat convective interface with the cooling liquid.

9. The system of claim 1, wherein the heat conduit is in forceful compressive contact between the liquid vessel and the electronic component.

10. The system of claim 9, wherein the forceful compressive contact comprises compressive contact of the liquid vessel with respect to the thermoelectric cooler.

11. The system of claim 9, wherein the forceful compressive contact comprises a cantilever load on the heat conduit with respect to the electronic component.

12. The system of claim 9, wherein the heat conduit is in compressive contact by being in conductive contact with a top face of the electronic component.

13. A method of cooling, the method comprising:
    providing a system comprising:
        a liquid vessel that defines an interior space having an interior surface therein, the liquid vessel being configured to hold a cooling liquid and an electronic component, wherein the electronic component is positioned within the cooling liquid of the interior space;

a heat conduit in heat conductive contact with the electronic component and configured to conductively transfer heat from the electronic component; and a thermoelectric cooler positioned within the cooling liquid of the interior space, the thermoelectric cooler including an absorption side in contact with the heat conduit and a rejection side in contact with the interior surface, the thermoelectric cooler being configured to transfer heat from the heat conduit to the interior surface of the liquid vessel;

determining whether a predetermined condition is met for activating the thermoelectric cooler; and activating the thermoelectric cooler in response to determining that the predetermined condition has been met, such that the heat conduit to transfer heat from the electronic component to the cooling liquid and configured to transfer heat from the electronic component to the absorption side of the thermoelectric cooler.

14. The method of claim 13, wherein determining whether a predetermined condition is met comprises determining whether a temperature of the electronic component exceeds a predetermined temperature.

15. The method of claim 13, wherein the electronic component comprises a processor, and wherein determining whether a predetermined condition is met comprises determining whether a speed of the processor exceeds a predetermined processor speed.

16. The system of claim 1, wherein the thermoelectric cooler is immersed in the cooling liquid.

17. The method of claim 13, wherein the heat conduit is configured to transfer heat from the electronic component to the absorption side of the thermoelectric cooler when the thermoelectric cooler is activated.

18. The method of claim 13, wherein the thermoelectric cooler is immersed in the cooling liquid.

19. The method of claim 13, wherein the heat conduit is configured to transfer heat from the electronic component to the absorption side of the thermoelectric cooler when the thermoelectric cooler is activated.

* * * * *